United States Patent
Kogawa et al.

(10) Patent No.: US 10,492,307 B2
(45) Date of Patent: Nov. 26, 2019

(54) METHOD FOR FORMING INSULATING LAYER, METHOD FOR PRODUCING ELECTRONIC DEVICE, AND ELECTRONIC DEVICE

(71) Applicant: JAPAN AVIATION ELECTRONICS INDUSTRY, LIMITED, Tokyo (JP)

(72) Inventors: Yutaro Kogawa, Tokyo (JP); Mitsunori Sato, Tokyo (JP); Yutaka Takezawa, Tokyo (JP); Akitoshi Sakaue, Tokyo (JP); Mitsutoshi Naito, Tokyo (JP)

(73) Assignee: JAPAN AVIATION ELECTRONICS INDUSTRY, LIMITED, Tokyo (JP)

(*) Notice: Subject to any disclaimer, the term of this patent is extended or adjusted under 35 U.S.C. 154(b) by 0 days.

(21) Appl. No.: 15/860,731

(22) Filed: Jan. 3, 2018

(65) Prior Publication Data
US 2018/0132363 A1    May 10, 2018

Related U.S. Application Data

(62) Division of application No. 15/363,421, filed on Nov. 29, 2016.

(30) Foreign Application Priority Data

Dec. 1, 2015    (JP) .................................. 2015-234443

(51) Int. Cl.
*H05K 3/28* (2006.01)
*H05K 3/46* (2006.01)
(Continued)

(52) U.S. Cl.
CPC ........... *H05K 3/4644* (2013.01); *G06F 3/044* (2013.01); *H05K 1/095* (2013.01); *H05K 3/125* (2013.01);
(Continued)

(58) Field of Classification Search
CPC ................................................... H05K 3/4644
(Continued)

(56) References Cited

U.S. PATENT DOCUMENTS 6,259,608 B1 * 7/2001 Berardinelli ...... H01L 23/49838
174/250
2013/0341209 A1 * 12/2013 Whyte ............... G01N 27/3272
205/782
(Continued)

FOREIGN PATENT DOCUMENTS

JP    2014-191169    10/2014

*Primary Examiner* — Stanley Tso
(74) *Attorney, Agent, or Firm* — Greenblum & Bernstein, P.L.C.

(57) ABSTRACT

By flexographic printing or inkjet printing, insulating ink is applied on a wiring pattern in accordance with a predetermined printing pattern. The insulating ink is hardened, whereby an insulating layer is formed. A contact region of the wiring pattern that is used for electrical connection with a conductor other than the wiring pattern is not covered with the insulating layer. The printing pattern is delimited by the outline of a non-printing region including the contact region. The wiring pattern includes, in the non-printing region, a trunk wiring line leading, to the contact region, from a position on the wiring pattern at which the wiring pattern overlaps with the outline and a branch wiring line extending from a point on at least one side of the trunk wiring line and terminating without making contact with the outline.

2 Claims, 10 Drawing Sheets

(51) Int. Cl.
  *G06F 3/044*   (2006.01)
  *H05K 1/09*    (2006.01)
  *H05K 3/12*    (2006.01)
  *H05K 1/11*    (2006.01)

(52) U.S. Cl.
  CPC ............ *H05K 3/1275* (2013.01); *H05K 3/28* (2013.01); *G06F 2203/04103* (2013.01); *G06F 2203/04111* (2013.01); *G06F 2203/04112* (2013.01); *H05K 1/115* (2013.01); *H05K 2201/0108* (2013.01); *H05K 2201/0979* (2013.01); *H05K 2201/09236* (2013.01); *H05K 2201/09254* (2013.01); *H05K 2203/013* (2013.01); *H05K 2203/0534* (2013.01); *Y10T 29/49155* (2015.01)

(58) Field of Classification Search
  USPC .......................................................... 174/250
  See application file for complete search history.

(56) References Cited

U.S. PATENT DOCUMENTS

| | | | |
|---|---|---|---|
| 2014/0062315 A1* | 3/2014 | Tischler ............. | H05B 33/0827 315/185 R |
| 2014/0307178 A1* | 10/2014 | Tang ........................ | G06F 3/044 349/12 |
| 2015/0271930 A1* | 9/2015 | Cok ........................ | G06F 3/044 156/60 |
| 2016/0231839 A1* | 8/2016 | Yoo ........................ | G06F 3/044 |
| 2017/0121548 A1* | 5/2017 | Hill ........................ | C09D 11/52 |

* cited by examiner

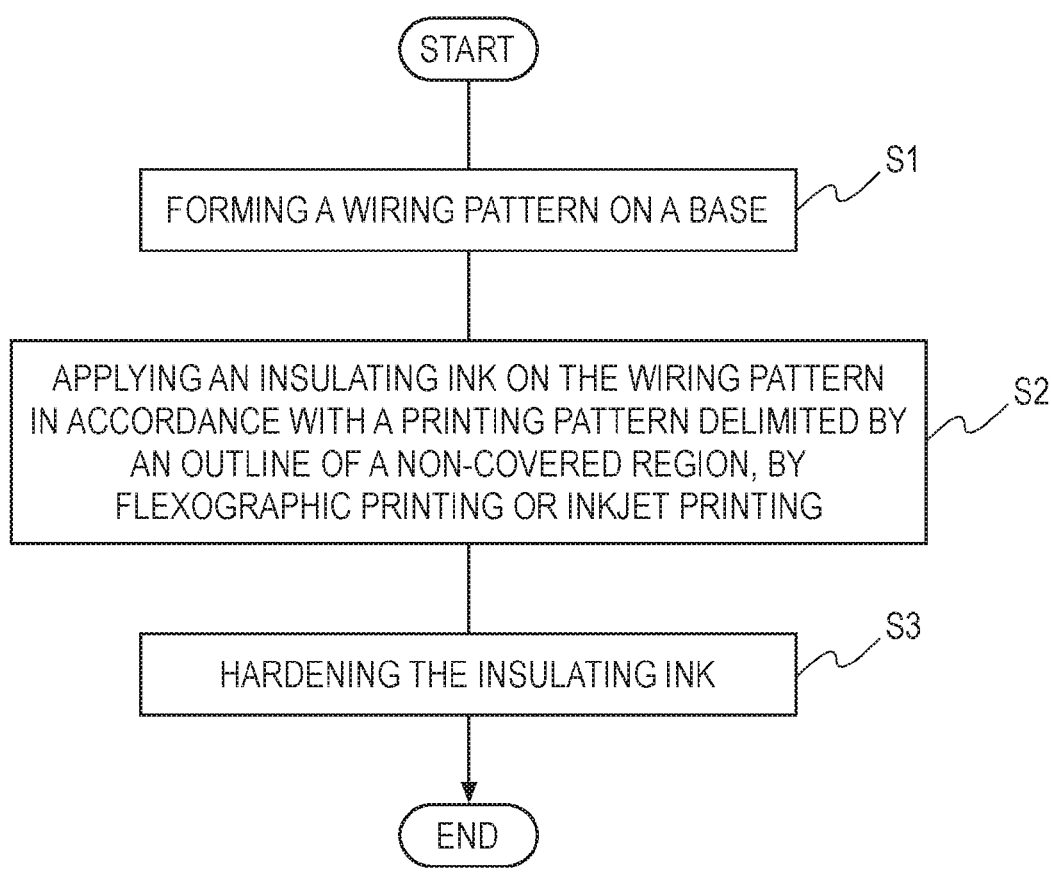

METHOD FOR FORMING INSULATING LAYER, METHOD FOR PRODUCING ELECTRONIC DEVICE, AND ELECTRONIC DEVICE

CROSS REFERENCES TO RELATED APPLICATIONS

This Application is a divisional application of the pending U.S. patent application Ser. No. 15/363,421, filed on Nov. 29, 2016, which claims priority to Japanese Patent Application No. 2015-234443, filed on Dec. 1, 2015, the contents of which are hereby incorporated by reference in their entireties.

TECHNICAL FIELD

This invention relates to a method for forming an insulating layer by flexographic printing or inkjet printing, a method for producing an electronic device, the method using the insulating layer formation method, and an electronic device including a wiring pattern and an insulating layer.

BACKGROUND ART

In the formation of component elements, such as a wiring pattern or an insulating layer, of an electronic device, by using not a vacuum process but a printing process, it is possible not only to achieve an improvement in productivity, but also to reduce costs because the printing process eliminates the need for an expensive film formation device.

Japanese Patent Application Laid Open No. 2014-191169 discloses using flexographic printing or inkjet printing in the formation of a semiconductor layer included in a thin-film transistor array, a protective layer covering the semiconductor layer, and an interlayer dielectric film covering the entire array.

The thin-film transistor array in Japanese Patent Application Laid Open No. 2014-191169 has a configuration in which a pixel electrode is formed on the interlayer dielectric film. A via hole is formed in the interlayer dielectric film for electrical continuity between the pixel electrode and a drain electrode.

Since low-viscosity ink is used in flexographic printing or inkjet printing, the ink flows noticeably. This makes it necessary to exercise care not to allow the ink to spread out of a desired printing pattern due to the flow of the ink.

In accordance with Japanese Patent Application Laid Open No. 2014-191169, the drain electrode that is made to be electrically continuous with the pixel electrode located on an upper layer of the interlayer dielectric film by the via hole of the interlayer dielectric film is a solid electrode (in other words, a plane electrode) forming the entire bottom face of the via hole. Therefore, even when the insulating ink forming the interlayer dielectric film spreads over the drain electrode located on the bottom face of the via hole, poor conduction is less likely to occur.

However, if a conductor for electrical connection which is exposed at the bottom face of the via hole is, for example, linear wiring extending from the outer edge of the via hole, the insulating ink may move on a wiring line and cover the wiring line. As a result, there is a high possibility of the occurrence of poor conduction.

SUMMARY OF THE INVENTION

A first object of this invention is to provide an insulating layer formation method that can prevent insulating ink, which may move on a wiring line of a wiring pattern, reaching a contact region of the wiring pattern which is used for electrical connection with a conductor other than the wiring pattern, when an insulating layer covering the wiring pattern is formed by flexographic printing or inkjet printing in such a way that the contact region is exposed.

A second object of this invention is to provide a method for producing an electronic device, the method using such an insulating layer formation method.

Furthermore, a third object of this invention is to provide an electronic device including a wiring pattern and an insulating layer that covers the wiring pattern in such a way that a contact region of the wiring pattern, which is used for electrical connection with a conductor other than the wiring pattern, is exposed, the electronic device in which the contact region is not covered with the insulating ink that has moved on a wiring line of the wiring pattern.

An insulating layer formation method of the present invention is a method for forming an insulating layer which covers a wiring pattern formed on a base in such a way that a region that belongs to the wiring pattern and is used for electrical connection with a conductor other than the wiring pattern (the region is hereinafter referred to as a contact region) is exposed, the method including: a) a step of forming the wiring pattern on the base; b) a step of applying insulating ink on the wiring pattern by flexographic printing or inkjet printing in accordance with a printing pattern delimited by the outline of a non-printing region including the contact region; and c) a step of forming the insulating layer by hardening the insulating ink.

In the non-printing region, the wiring pattern includes a trunk wiring line leading, to the contact region, from a position on the wiring pattern at which the wiring pattern overlaps with the outline; and a branch wiring line that extends from a point on at least one side of the trunk wiring line, except for both ends of the trunk wiring line, and terminates without making contact with the outline. Alternatively, in the non-printing region, the wiring pattern includes a parallel wiring line which is part of a wiring line leading, to the contact region, from a position on the wiring pattern at which the wiring pattern overlaps with the outline, and the parallel wiring line includes two nodes and at least two paths connecting the two nodes.

A method for producing an electronic device of the present invention includes a step of forming an insulating layer included in the electronic device, in which a method of forming the insulating layer is the insulating layer formation method described above.

An electronic device of the present invention includes: a wiring pattern formed on a base; and an insulating layer that covers the wiring pattern in such a way that a region that belongs to the wiring pattern and is used for electrical connection with a conductor other than the wiring pattern (the region is hereinafter referred to as a contact region) is exposed.

In a non-covered region including the contact region, the wiring pattern includes a trunk wiring line leading, to the contact region, from a position on the wiring pattern at which the wiring pattern overlaps with the outline of the non-covered region and a branch wiring line that extends from a point on at least one side of the trunk wiring line, except for both ends of the trunk wiring line, and terminates without making contact with the outline. Alternatively, in the non-covered region including the contact region, the wiring pattern includes a parallel wiring line which is part of a wiring line leading, to the contact region, from a position on the wiring pattern at which the wiring pattern overlaps with the outline of the non-covered region, and the parallel wiring line includes two nodes and at least two paths connecting the two nodes.

Effects of the Invention

According to this invention, since a wiring pattern in a non-printing region has a characteristic shape, even when an insulating layer covering the wiring pattern is formed by flexographic printing or inkjet printing in such a way that a contact region of the wiring pattern which is used for electrical connection with a conductor other than the wiring pattern is exposed, insulating ink forming the insulating layer by printing does not reach the contact region by moving on a wiring line. This makes it possible to prevent poor conduction from occurring in the contact region.

BRIEF DESCRIPTION OF THE DRAWINGS

FIG. 9 is a processing flow.

DETAILED DESCRIPTION OF THE EMBODIMENTS

Figure 1A:
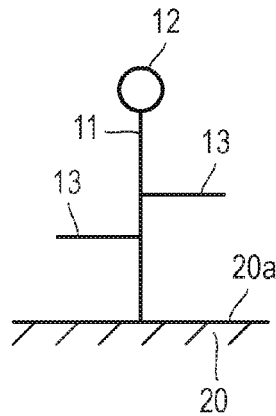
FIG. 1A is a diagram for explaining a first basic embodiment of this invention.

The brief overview of this invention is as follows (see FIG. 9).

A wiring pattern is formed on a base by using a conductor film (Step S1).

The wiring pattern is covered with an insulating layer in such a way that a contact region is exposed. The contact region is a region that belongs to the wiring pattern and is used for electrical connection with a conductor other than the wiring pattern. Specifically, insulating ink is applied on the wiring pattern by flexographic printing or inkjet printing in accordance with a printing pattern delimited by an outline of a non-covered region which is a region that includes the contact region therein and is not covered with the insulating layer (Step S2).

A structure that effectively increases the amount of retained ink without increasing electric resistance is provided somewhere on a wiring line leading, to the contact region, from a position on the wiring pattern at which the wiring pattern overlaps with the outline.

This prevents the insulating ink, which is used in printing for forming the insulating layer, from moving on the wiring line and reaching the contact region.

The insulating layer is formed by hardening the insulating ink (Step S3).

First, a basic embodiment of this invention will be described with reference to FIGS. 1A and 2A. In the drawings, only some of the same component elements are sometimes identified with a reference character to make the drawings easy to see.

A printing pattern of an insulating layer is delimited by the outline of a non-printing region (that is, a non-covered region). Insulating ink is applied on a wiring pattern in accordance with the printing pattern of the insulating layer and the insulating ink is then hardened, whereby the insulating layer is formed. In FIG. 1A, a trunk wiring line 11 is the shortest one of wiring lines leading, to a contact region 12, from positions on the wiring pattern at which the wiring pattern overlaps with an outline 20a of an insulating layer 20. On each side of the trunk wiring line 11, one branch wiring line 13 that branches off from the trunk wiring line 11 and terminates without making contact with the outline 20a is provided.

In the wiring pattern having the configuration depicted in FIG. 1A, each branch wiring line 13 has no ink flow spot other than a connection site between the branch wiring line 13 and the trunk wiring line 11. Thus, the progress of insulating ink 90, which are moving on the trunk wiring line 11, toward the contact region 12, from the position on the wiring pattern at which the wiring pattern overlaps with the outline 20a, branches off at the connection site between the branch wiring line 13 and the trunk wiring line 11. The branch wiring line 13 plays the role of retaining the insulating ink 90 that has entered the branch wiring line 13. Since the amount of the insulating ink 90 moving on the trunk wiring line 11 toward the contact region 12 reduces every time the insulating ink 90 passes through the connection site between the branch wiring line 13 and the trunk wiring line 11, the insulating ink 90 does not reach the contact region 12. That is, the insulating ink 90 does not reach the contact region 12 even when, after the application of the insulating ink 90, the insulating ink 90 reaches part of the trunk wiring line 11 or even at least part of the branch wiring line 13. In this state, the insulating ink 90 is hardened.

Figure 1B:
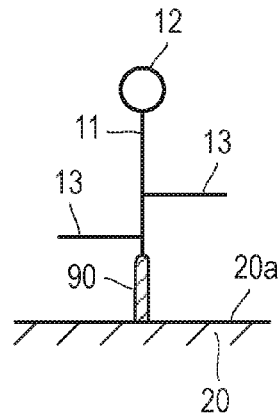
FIG. 1B is a diagram schematically depicting an example of the state of insulating ink which has stopped on a wiring pattern in the first basic embodiment.
Figure 1C:
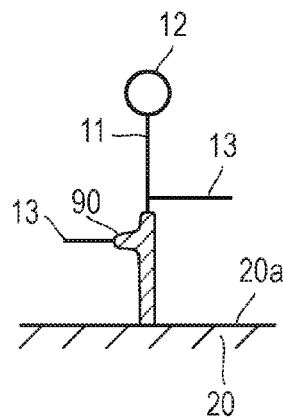
FIG. 1C is a diagram schematically depicting an example of the state of the insulating ink which has stopped on the wiring pattern in the first basic embodiment.
Figure 1D:
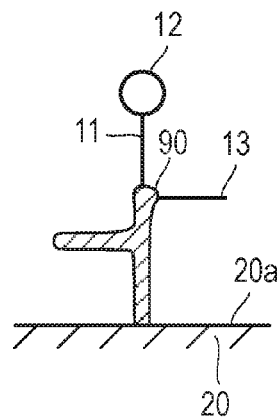
FIG. 1D is a diagram schematically depicting an example of the state of the insulating ink which has stopped on the wiring pattern in the first basic embodiment.
Figure 1E:
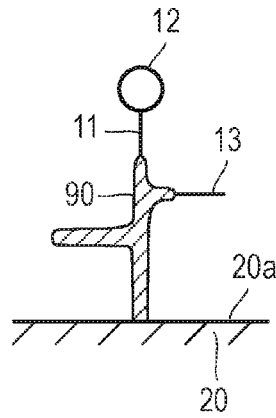
FIG. 1E is a diagram schematically depicting an example of the state of the insulating ink which has stopped on the wiring pattern in the first basic embodiment.

A situation in which the insulating ink 90 does not reach the contact region 12 is schematically depicted in FIGS. 1B to 1E. FIG. 1B depicts a state in which the progress of the insulating ink 90 which started moving on the trunk wiring line 11 from the position on the wiring pattern, at which the wiring pattern overlaps with the outline 20a, toward the contact region 12 has stopped before the insulating ink 90 reaches a first connection site between the branch wiring line 13 and the trunk wiring line 11 (the term "first" here is defined by the flow direction of the insulating ink). FIG. 1C depicts a state in which the progress of the insulating ink 90 moving on the trunk wiring line 11 has stopped immediately after the insulating ink 90 branched off at the first connection site between the branch wiring line 13 and the trunk wiring line 11. FIG. 1D depicts a state in which the progress of the insulating ink 90 further moving on the trunk wiring line 11 after the insulating ink 90 branched off at the first connection site between the branch wiring line 13 and the trunk wiring line 11 has stopped at a second connection site between the branch wiring line 13 and the trunk wiring line 11 (the term "second" here is defined by the flow direction of the insulating ink). As depicted in FIGS. 1C and 1D, at the connection site between the branch wiring line 13 and the trunk wiring line 11, an ink pool is formed by the surface tension of the insulating ink 90. FIG. 1E depicts a state in which the progress of the insulating ink 90 further moving on the trunk wiring line 11 after the insulating ink 90 branched off at the second connection site between the branch wiring line 13 and the trunk wiring line 11 has stopped before the insulating ink 90 reaches the contact region 12. In actuality, there are various stopped states of the insulating ink 90 on the wiring pattern, and each of the stopped states of the insulating ink 90 depicted in FIGS. 1B to 1E is merely an example.

Figure 2A:
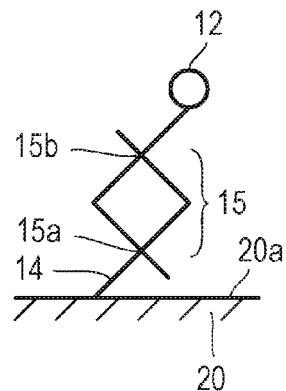
FIG. 2A is a diagram for explaining a second basic embodiment of this invention.

FIG. 2A depicts a parallel wiring line 15 which is part of the wiring line leading, to the contact region 12, from the position on the wiring pattern at which the wiring pattern overlaps with the outline 20a of the insulating layer 20. The parallel wiring line 15 includes two nodes and at least two paths (in an example depicted in FIG. 2A, two paths having a first node 15a as a common starting point and a second node 15b as a common end point; however, the "starting point" and the "end point" here are defined by the flow direction of the insulating ink) connecting the two nodes. Any one of the at least two paths is included in the shortest one of wiring lines leading, to the contact region 12, from positions on the wiring pattern at which the wiring pattern overlaps with the outline 20a of the insulating layer 20. In the example depicted in FIG. 2A, four wiring lines meet at each of the first and second nodes 15a and 15b. Two wiring lines (that is, two paths), a wiring line 14 connecting the first node 15a with the insulating layer 20, and one branch wiring line which terminates without making contact with the outline 20a are connected to the first node 15a. Two wiring lines (that is, two paths), a wiring line connecting the second node 15b with the contact region 12, and one branch wiring line which terminates without making contact with the outline 20a are connected to the second node 15b.

In the wiring pattern depicted in FIG. 2A, an increase in the wiring length produced by branching off of the wiring line produces the same effect as that of the branch wiring line 13 depicted in FIGS. 1A to 1E. Furthermore, at each of the nodes 15a and 15b, an ink pool is formed by the surface tension of the ink. The ink pool has unique liquid retention capability. Therefore, since the amount of the insulating ink moving on the wiring line toward the contact region 12 reduces every time the insulating ink passes through the node, the insulating ink does not reach the contact region 12. That is, the insulating ink does not reach the contact region 12 even when, after the application of the insulating ink, the insulating ink moves on at least part of the wiring line leading, to the contact region 12, from the position on the wiring pattern at which the wiring pattern overlaps with the outline 20a. In this state, the insulating ink is hardened.

Figure 2B:
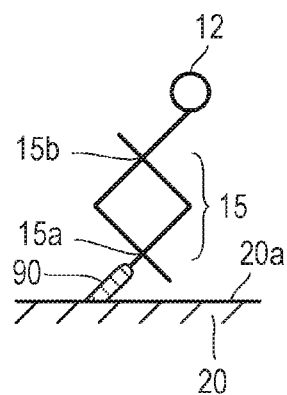
FIG. 2B is a diagram schematically depicting an example of the state of the insulating ink which has stopped on a wiring pattern in the second basic embodiment.
Figure 2C:
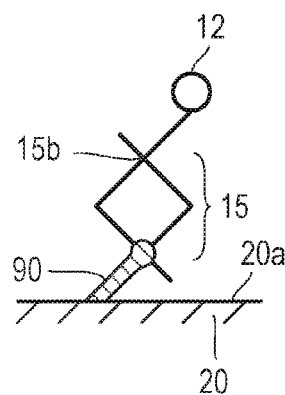
FIG. 2C is a diagram schematically depicting an example of the state of the insulating ink which has stopped on the wiring pattern in the second basic embodiment.
Figure 2D:
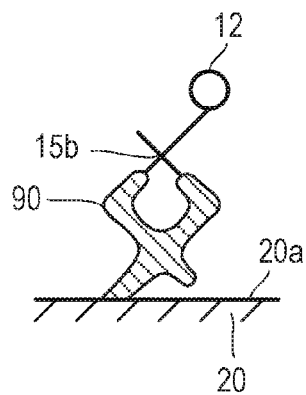
FIG. 2D is a diagram schematically depicting an example of the state of the insulating ink which has stopped on the wiring pattern in the second basic embodiment.
Figure 2E:
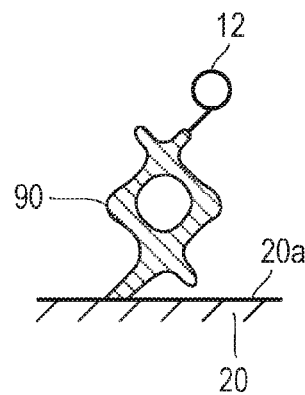
FIG. 2E is a diagram schematically depicting an example of the state of the insulating ink which has stopped on the wiring pattern in the second basic embodiment.

A situation in which the insulating ink 90 does not reach the contact region 12 is schematically depicted in FIGS. 2B to 2E. FIG. 2B depicts a state in which the progress of the insulating ink 90 which started moving on the wiring pattern (specifically, the wiring line 14) from the position on the wiring pattern, at which the wiring pattern overlaps with the outline 20a, toward the contact region 12 has stopped before the insulating ink 90 reaches the first node 15a. FIG. 2C depicts a state in which the progress of the insulating ink 90 moving on the wiring line 14 has stopped at the first node 15a. As depicted in FIG. 2C, an ink pool is formed at the node by the surface tension of the insulating ink 90. FIG. 2D depicts a state in which the progress of the insulating ink 90 further moving on the two paths after the insulating ink 90 branched off at the first node 15a has stopped before the insulating ink 90 reaches the second node 15b. FIG. 2E depicts a state in which the progress of the insulating ink 90 further moving on the wiring pattern after the insulating ink 90 branched off at the second node 15b has stopped before the insulating ink 90 reaches the contact region 12. In actuality, there are various stopped states of the insulating ink 90 on the wiring pattern, and each of the stopped states of the insulating ink 90 depicted in FIGS. 2B to 2E is merely an example.

The branch wiring line 13 depicted in FIG. 1A does not affect the electric resistance of the trunk wiring line 11. Moreover, in the configuration of FIG. 2A, since a reduction in electric resistance caused by the parallel wiring line 15 (in other words, the parallel connection of lines) exceeds an increase in electric resistance caused by an increase in the wiring length thereof, this configuration holds promise of producing beneficial electrical effects.

Figure 1F:
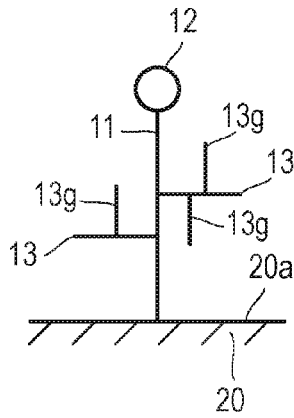
FIG. 1F is a diagram for explaining a modified example of the embodiment depicted in FIG. 1A.

The configuration of the wiring pattern is not limited to such a configuration as depicted in FIG. 1A in which one branch wiring line 13 is provided on each side of the trunk wiring line 11. The following configurations are also allowed: a configuration in which one or more branch wiring lines 13 are provided on any one of the sides of the trunk wiring line 11; and a configuration in which two or more branch wiring lines 13 are provided on each side of the trunk wiring line 11. The insulating ink 90 does not always travel in such a way as to cover the trunk wiring line 11, in other words, wet the upper face and the side faces of the trunk wiring line 11 continuously as schematically depicted in FIGS. 1A to 1E. For instance, the insulating ink 90 sometimes travels along only one side face of the trunk wiring line 11 and sometimes travels along both side faces of the trunk wiring line 11 independently. Thus, it is desirable to provide at least one branch wiring line 13 on each side of the trunk wiring line 11. Moreover, additional multiple branches 13g of wiring lines may be added to the branch wiring line 13 (see FIG. 1F). The addition of a branch wiring line makes it possible to increase effectively the amount of retained ink in a limited area and prevent the insulating ink from reaching the contact region 12 more effectively.

Figure 2F:
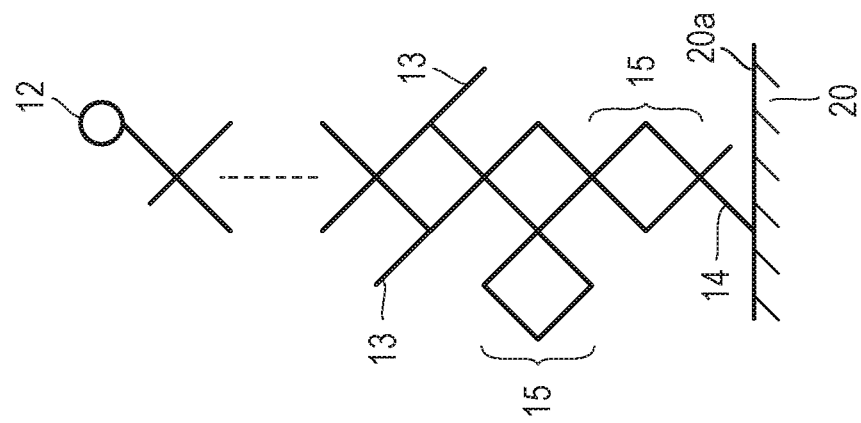
FIG. 2F is a diagram for explaining an expanded form of the embodiment depicted in FIG. 2A.
Figure 2G:
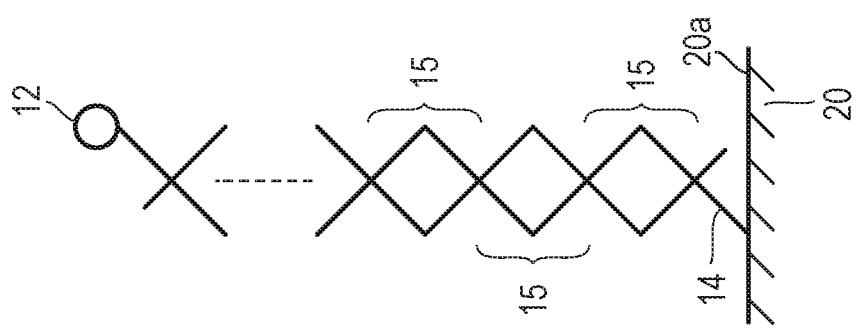
FIG. 2G is a diagram for explaining a modified example of the embodiment depicted in FIG. 2F.

Two or more parallel wiring lines 15 (each parallel wiring line 15 is depicted in FIG. 2A) may be serially concatenated. In that case, a form in which the second node 15b of one parallel wiring line 15 doubles as the first node 15a of the adjacent parallel wiring line 15 is advantageous in terms of area efficiency. A parallel wiring line string that takes such a form is depicted in FIG. 2F. The greater the number of parallel wiring lines 15 included in the parallel wiring line string becomes, the greater the effect of preventing the insulating ink from reaching the contact region 12 becomes. Another branch wiring line or node may be formed outside the parallel wiring line string depicted in FIG. 2F (see FIG. 2G).

Moreover, a wiring pattern including parallel wiring line strings (each parallel wiring line string is depicted in FIG. 2F) is also possible. In this wiring pattern, the adjacent parallel wiring line strings are connected in parallel. In such a form, assume that the amounts of insulating ink flowing into the parallel wiring line strings from the printing pattern of the insulating layer are equal to each other. Then, since the insulating ink coming from and going to the adjacent parallel wiring line strings is cancelled out, the amount of ink flowing from the adjacent parallel wiring line strings is approximately zero. Therefore, since the connection points of the adjacent parallel wiring line strings function as nodes, the amount of retained ink remarkably increases.

The number of wiring lines that meet at the node is four in FIGS. 2A and 2F, but the number only have to be three or more. The amount of retained ink at the node in an X-shaped model in which four wiring lines meet at the node as depicted in FIGS. 2A and 2F is greater than the amount of retained ink at the node in a Y-shaped model in which three wiring lines meet at the node.

Next, a configuration of an electronic device having the configuration of the above-described wiring pattern and an insulating layer covering the wiring pattern will be specifically described.

Figure 3:
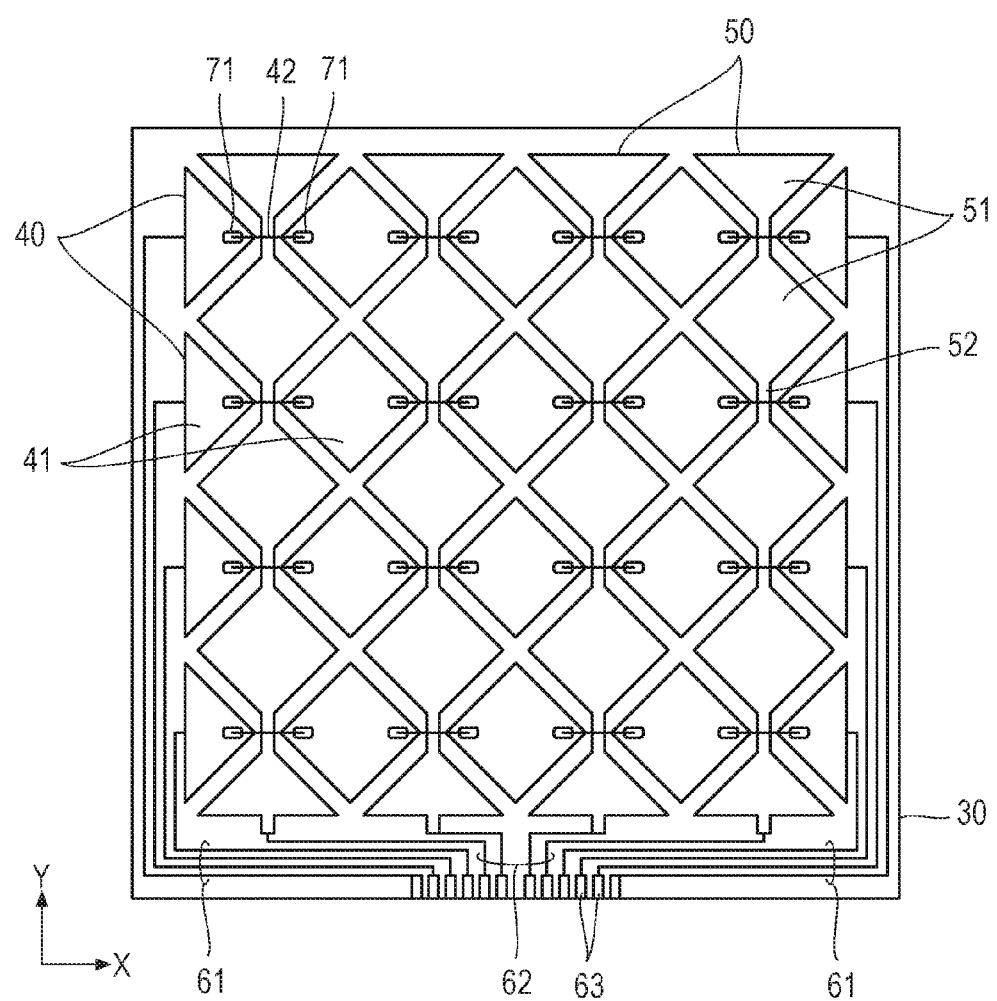
FIG. 3 is a plan view depicting an embodiment of an electronic device according to this invention.

FIG. 3 depicts the configuration of a capacitive touch panel as an example of such an electronic device.

This touch panel has a configuration in which a first conductor film, an insulating layer, a second conductor film, and a protective film are stacked in order on a square transparent substrate 30. Sensor electrode lines include first sensor electrode lines 40 and second sensor electrode lines 50.

Each first sensor electrode line 40 includes island-shaped electrodes 41 and jumper wires 42, the island-shaped electrodes 41 being arranged in an X direction parallel to one side of the transparent substrate 30 and the jumper wires 42 each coupling the adjacent island-shaped electrodes 41. The first sensor electrode lines 40 are arranged in parallel in a Y direction that is parallel to the other side adjacent to the above-described one side of the transparent substrate 30. Each second sensor electrode line 50 includes island-shaped electrodes 51 and coupling portions 52, the island-shaped electrodes 51 being arranged in the Y direction and the coupling portions 52 each coupling the adjacent island-shaped electrodes 51. The second sensor electrode lines 50 are arranged in parallel in the X direction.

Two lead-out wiring lines 61 are connected to both ends in the X direction of each first sensor electrode line 40, and a lead-out wiring line 62 is connected to one end in the Y direction of each second sensor electrode line 50. Terminals 63 are arranged and formed in a central part on one side (in this example, a lower side) of the transparent substrate 30, and the lead-out wiring lines 61 and 62 are connected to the terminals 63.

The second sensor electrode lines 50, the lead-out wiring lines 61 and 62, the terminals 63, and the island-shaped electrodes 41 of the first sensor electrode lines 40 are formed of the first conductor film. The jumper wires 42 of the first sensor electrode lines 40 are formed of the second conductor film which is insulated from the first conductor film by the insulating layer. Both ends of each jumper wire 42 are connected to the island-shaped electrodes 41 via through holes 71 provided in the insulating layer. The jumper wires 42 and the coupling portions 52 are located in positions where the jumper wires 42 and the coupling portions 52 overlap one another. Though not specifically depicted in FIG. 3, the second sensor electrode lines 50, the island-shaped electrodes 41 of the first sensor electrode lines 40, and the terminals 63 are each formed of a mesh made of conductor fine lines.

In the touch panel having the above-described configuration, a wiring pattern formed of the first conductor film and a wiring pattern formed of the second conductor film are each formed by a printing method using conductive ink containing conductive particles such as silver particles, in this example, by gravure offset printing. Moreover, the insulating layer and the protective film are formed by a printing method using insulating ink, specifically, by flexographic printing or inkjet printing.

Figure 4A:
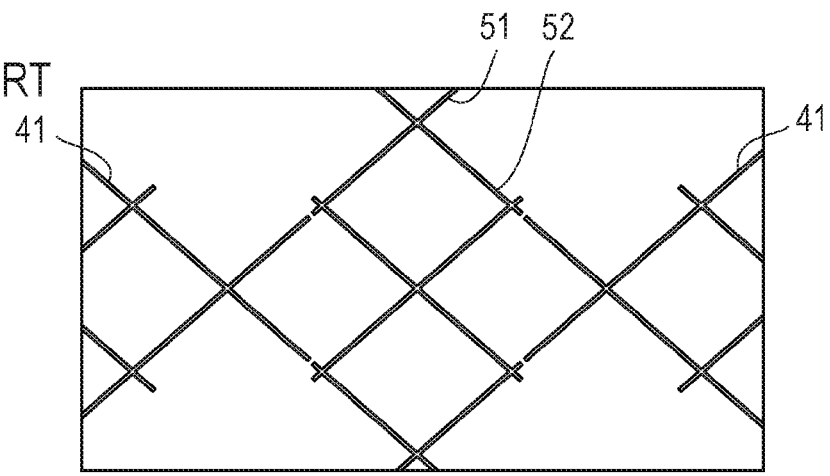
FIG. 4A is an enlarged view of an area near a connection part of a jumper wire in FIG. 3 before the formation of an insulating layer (when an existing wiring pattern is used).
Figure 4B:
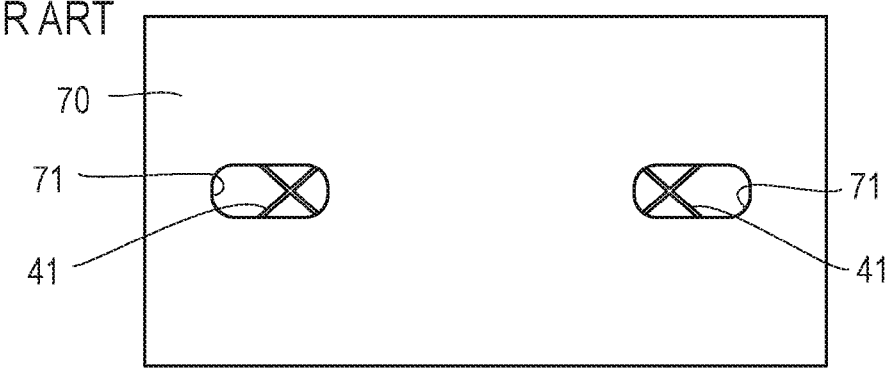
FIG. 4B is an enlarged view of the area near the connection part of the jumper wire in FIG. 3 after the formation of the insulating layer (when the existing wiring pattern is used).
Figure 4C:
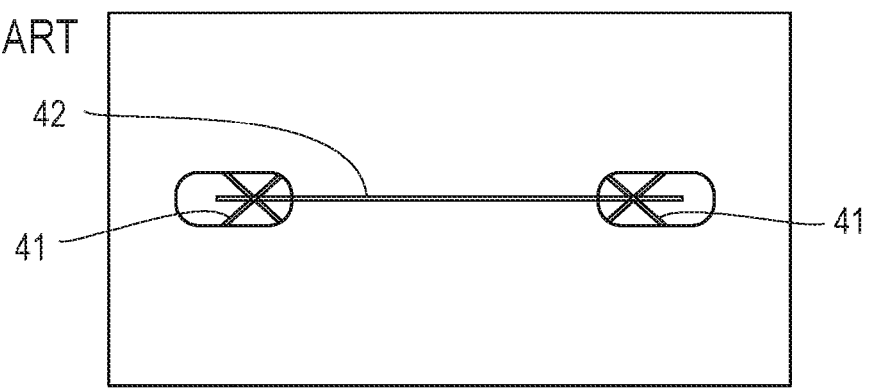
FIG. 4C is an enlarged view of the area near the connection part of the jumper wire in FIG. 3 after the formation of the jumper wire (when the existing wiring pattern is used).
Figure 4D:
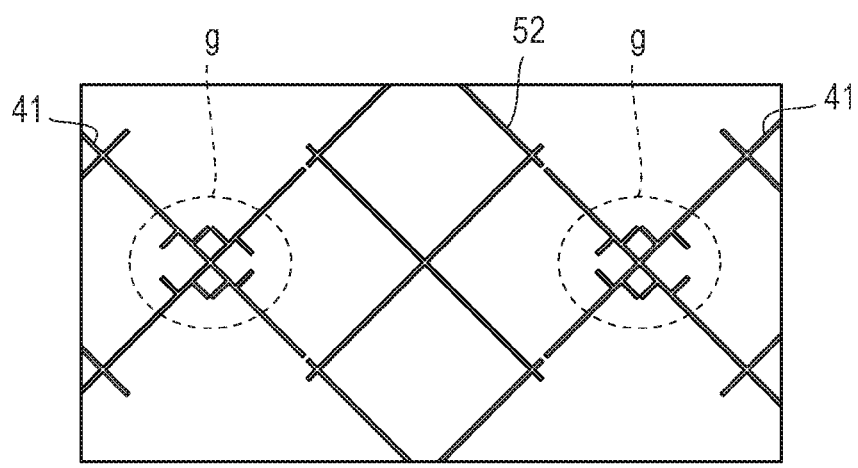
FIG. 4D is an enlarged view of an area near a connection part of a jumper wire in FIG. 3 before the formation of an insulating layer (when the wiring pattern of the embodiment is used).
Figure 4E:
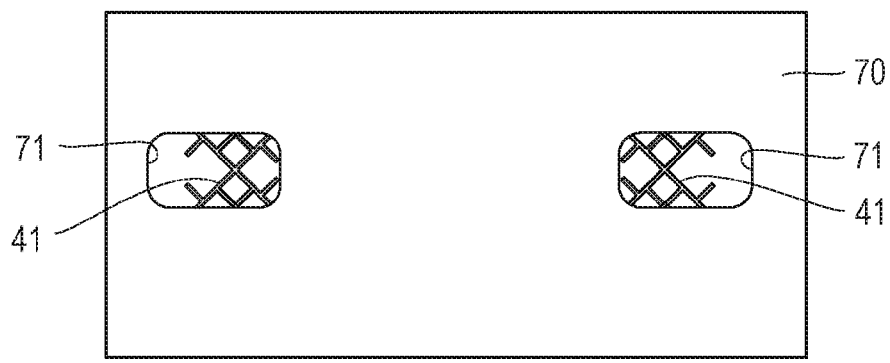
FIG. 4E is an enlarged view of the area near the connection part of the jumper wire in FIG. 3 after the formation of the insulating layer (when the wiring pattern of the embodiment is used).
Figure 4F:
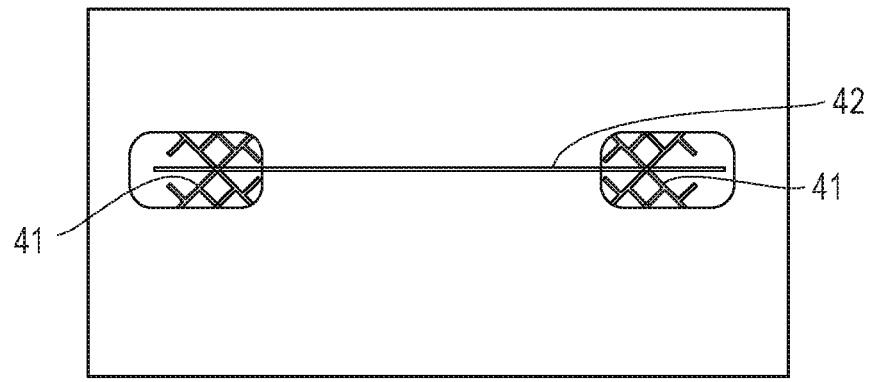
FIG. 4F is an enlarged view of the area near the connection part of the jumper wire in FIG. 3 after the formation of the jumper wire (when the wiring pattern of the embodiment is used).

FIGS. 4A to 4C depict the details of a connection part of the jumper wire 42, and FIGS. 4D to 4F depict a configuration adopting the wiring pattern depicted in FIG. 1A. FIGS. 4A to 4C depict, as a comparative example, a configuration that does not adopt the wiring pattern depicted in FIG. 1A.

FIGS. 4A to 4C and FIGS. 4D to 4F depict the configurations in the order of processes. First, descriptions will be given with reference to FIGS. 4A to 4C. As depicted in FIG. 4A, the island-shaped electrodes 51 and the coupling portions 52 of the second sensor electrode lines 50 and the island-shaped electrodes 41 of the first sensor electrode lines 40 are formed of a mesh made of conductor fine lines. On this wiring pattern, an insulating layer 70 is formed as depicted in FIG. 4B in such a way that a connection part of each jumper wire 42 is exposed. Each end of the adjacent island-shaped electrodes 41 are exposed as depicted in FIG. 4B through the through holes 71 of the insulating layer 70. In this example, the external shape of part of the mesh of the island-shaped electrodes 41, the part exposed by each through hole 71, is the shape of the letter X. FIG. 4C depicts a state in which the adjacent island-shaped electrodes 41 are connected by the jumper wire 42 formed by printing.

Figure 5A:
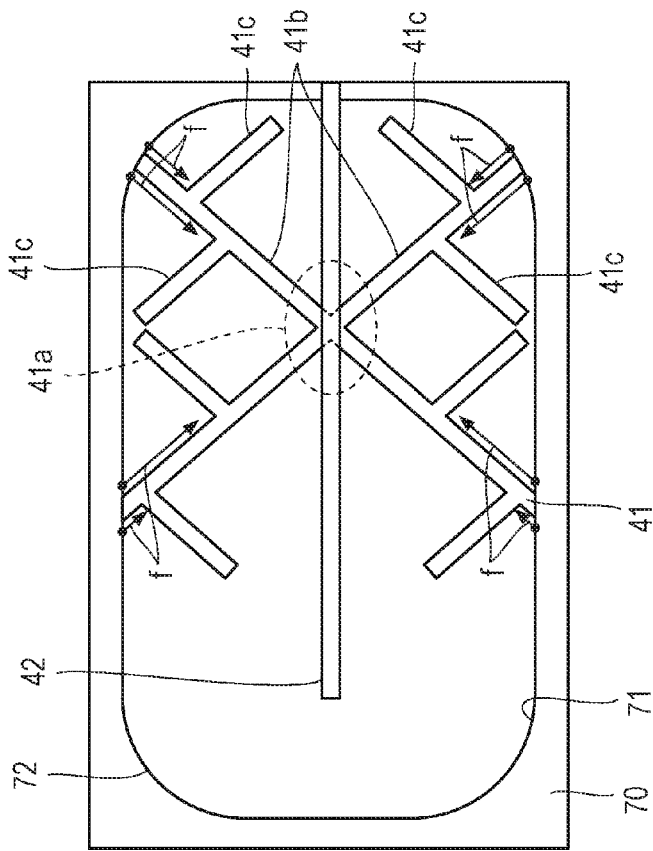
FIG. 5A is a partially enlarged view of FIG. 4C.

If the insulating ink that is used to form the insulating layer 70 by printing moves on the wiring line, electrical connection between the island-shaped electrodes 41 and the jumper wire 42 may be impaired. FIG. 5A depicts such a situation by enlarging part of FIG. 4C. In FIG. 5A, a region surrounded with a broken line is a contact region 41a of the island-shaped electrodes 41 which is used for the electrical connection. Arrows f indicate the flow of the insulating ink.

If the insulating ink moves on the wiring lines as indicated by the arrows f from the outline 72 of the insulating layer 70 surrounding the through hole 71, the contact region 41a is covered with the insulating ink and the electrical connection is impaired.

Figure 5B:
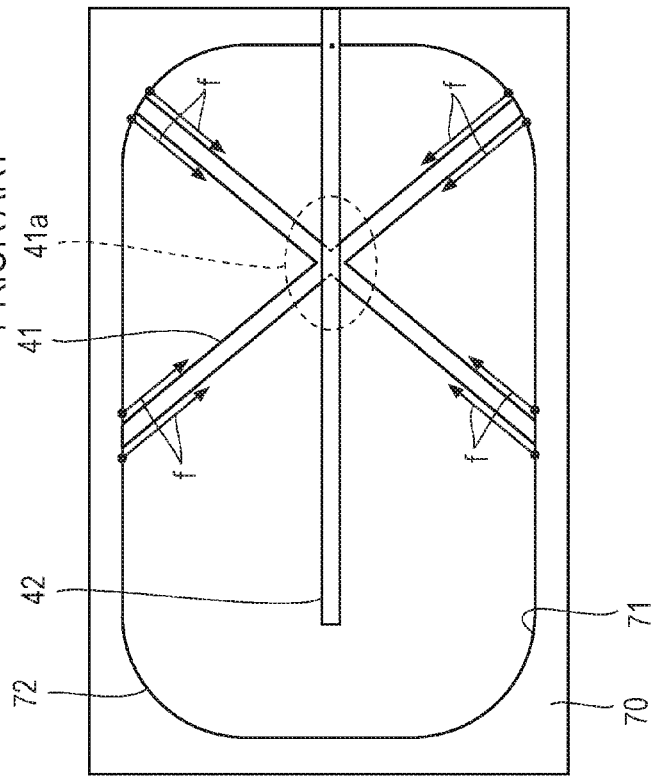
FIG. 5B is a partially enlarged view of FIG. 4F.

The effect which is obtained when the configuration of the wiring pattern depicted in FIG. 1A is adopted as indicated in FIG. 4D by broken lines g surrounding the configuration will be explained. FIGS. 4E and 4F and FIG. 5B depict the configurations corresponding to those in FIGS. 4B and 4C and FIG. 5A, respectively.

The external shape of part of the mesh of the island-shaped electrodes 41, the part exposed through the through holes 71 of the insulating layer 70, is the shape of the letter X. In this example, each of four wiring lines 41b leading to a contact region 41a corresponds to the trunk wiring line 11 in FIG. 1A. One branch wiring line 41c is provided on each side of each wiring line 41b. Therefore, even when the insulating ink moves on the wiring lines 41b as indicated by arrows f, it is possible to prevent the insulating ink from reaching the contact region 41a. This makes it possible to provide good connection between the jumper wire 42 and the island-shaped electrodes 41 without the occurrence of poor conduction.

Next, an example of an electronic device adopting the wiring pattern depicted in FIG. 2A will be described.

Figure 6:
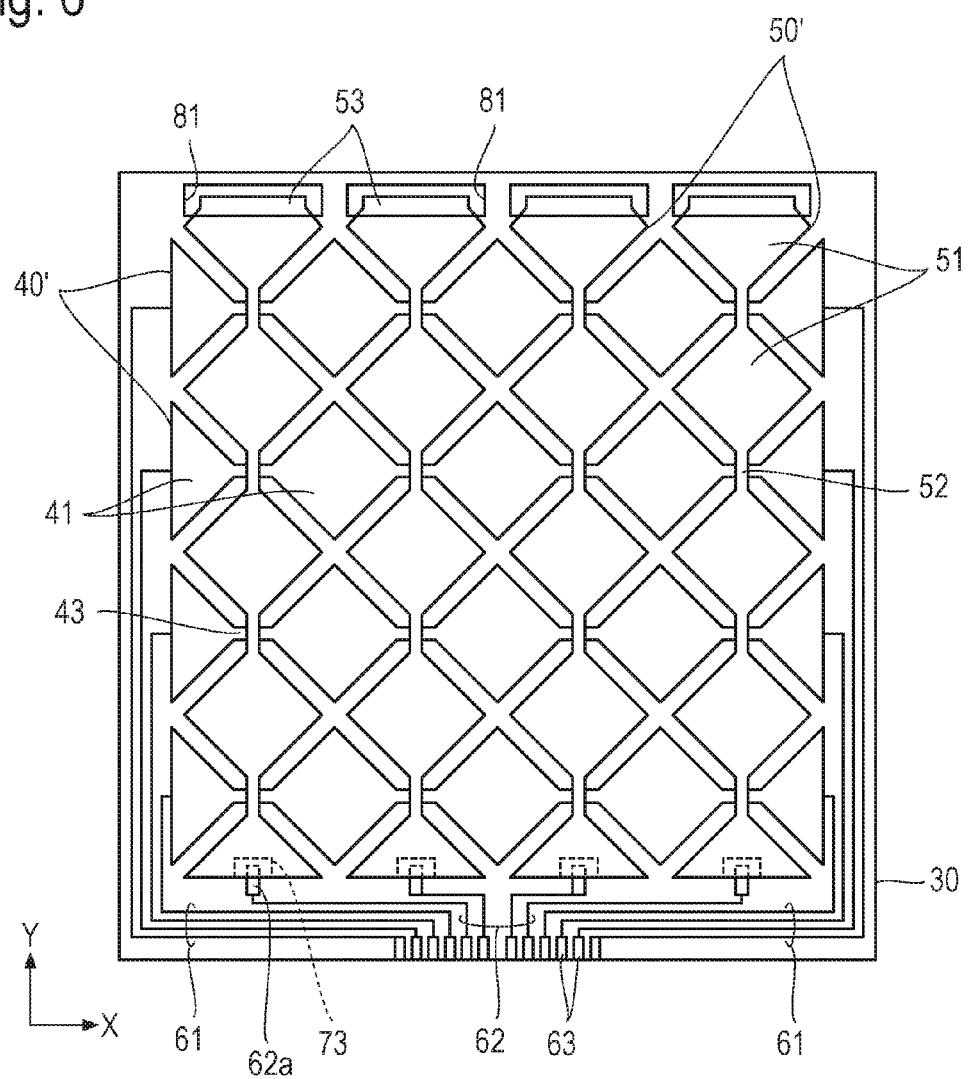
FIG. 6 is a plan view depicting another embodiment of the electronic device according to this invention.

FIG. 6 depicts the configuration of a capacitive touch panel having the configuration of the wiring pattern depicted in FIG. 2A.

As is the case with the touch panel depicted in FIG. 3, this touch panel has a configuration in which a first conductor film, an insulating layer, a second conductor film, and a protective film are stacked in order on a square transparent substrate 30. A wiring pattern formed of the first conductor film and a wiring pattern formed of the second conductor film are each formed by a printing method using conductive ink, in this example, by gravure offset printing. The insulating layer and the protective film are formed by a printing method using insulating ink, specifically, by flexographic printing or inkjet printing.

The touch panel depicted in FIG. 6 differs from the touch panel depicted in FIG. 3 in the formation of sensor electrode lines. In this example, the sensor electrode lines include first sensor electrode lines 40' and second sensor electrode lines 50'. Each first sensor electrode line 40' includes island-shaped electrodes 41 and coupling portions 43, the island-shaped electrodes 41 being arranged in an X direction and the coupling portions 43 each coupling the adjacent island-shaped electrodes 41. The island-shaped electrodes 41 and the coupling portions 43 are formed of the first conductor film. The first sensor electrode lines 40' are arranged in parallel in the Y direction. Each second sensor electrode line 50' includes island-shaped electrodes 51 and coupling portions 52, the island-shaped electrodes 51 being arranged in the Y direction and the coupling portions 52 each coupling the adjacent island-shaped electrodes 51. The island-shaped electrodes 51 and the coupling portions 52 are formed of the second conductor film which is insulated from the first conductor film by the insulating layer. The second sensor electrode lines 50' are arranged in parallel in the X direction. The first sensor electrode lines 40' and the second sensor electrode lines 50' are crossed in a state in which the first sensor electrode lines 40' and the second sensor electrode lines 50' are insulated from each other, and the coupling portions 43 and the coupling portions 52 are located in positions where the coupling portions 43 and the coupling portions 52 overlap one another.

Lead-out wiring lines 61 and 62 and terminals 63 are formed of the first conductor film. At the other end of each lead-out wiring line 62 on the side opposite to one end of the lead-out wiring line 62 which is connected to the corresponding terminal 63, a connection portion 62a that is connected to the corresponding one of the second sensor electrode lines 50' is formed. The second sensor electrode lines 50' and the connection portions 62a are connected to each other via through holes 73 formed in the insulating layer.

For each second sensor electrode line 50', an inspection terminal 53 is integrally formed in the island-shaped electrode 51 located at the other end of the second sensor electrode line 50' on the side opposite to one end of the second sensor electrode line 50' that is connected to the connection portion 62a. In the protective film, through holes 81 through which the inspection terminals 53 are exposed are formed.

Although the details of the first sensor electrode lines 40', the second sensor electrode lines 50', the connection portions 62a of the lead-out wiring lines 62, the terminals 63, and the inspection terminals 53 are not depicted in FIG. 6 as in FIG. 3, the first sensor electrode lines 40', the second sensor electrode lines 50', the connection portions 62a of the lead-out wiring lines 62, the terminals 63, and the inspection terminals 53 are formed of a mesh made of conductor fine lines.

Figure 7:
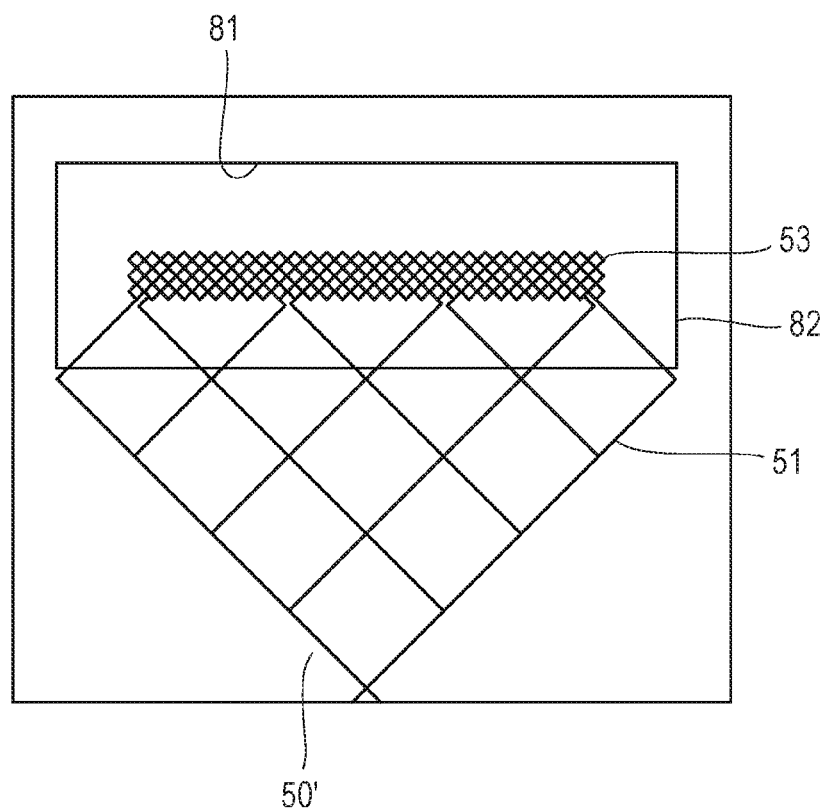
FIG. 7 is a partially enlarged view of an area near an inspection terminal in FIG. 6.

FIG. 7 depicts the details of an area near each inspection terminal 53 in a perspective view. The inspection terminals 53 are used to perform an electrical inspection to check whether or not each second sensor electrode line 50' has a predetermined resistance value after the formation of the protective film on the second conductor film. The electrical inspection is performed by using the inspection terminals 53 and the terminals 63. A similar electrical inspection of the first sensor electrode lines 40' can be performed by using the two terminals 63 to which the lead-out wiring lines 61 leading out of both ends of each first sensor electrode line 40' are connected.

As depicted in FIG. 7, the pitch of the mesh of the inspection terminal 53 linked to the island-shaped electrode 51 is narrower than the pitch of the mesh of the island-shaped electrode 51. Moreover, the mesh of the inspection terminal 53 corresponds to the configuration in which another branch wiring line or node is provided outside the parallel wiring line string depicted in FIG. 2F as mentioned earlier. Therefore, even when the insulating ink that is used to form the protective film moves on the wiring line (that is, the mesh) of the island-shaped electrode 51 from the outline 82 of the protective film surrounding the through hole 81, it is possible to prevent the entire inspection terminal 53 from being covered with the insulating ink.

Figure 8:
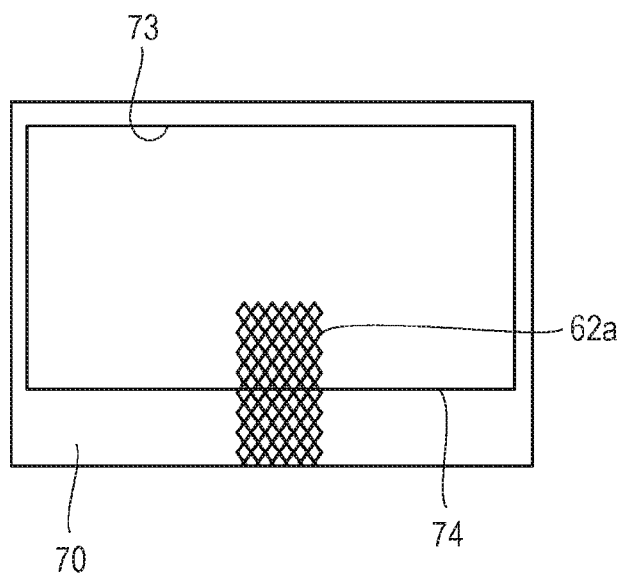
FIG. 8 is a partially enlarged view of an area near a connection portion in FIG. 6.

FIG. 8 depicts the details of an area near the connection portion 62a of each lead-out wiring line 62 in a perspective view. The mesh of the connection portion 62a exposed through the through hole 73 corresponds to the configuration in which parallel wiring line strings (each parallel wiring line string is similar to the parallel wiring line string depicted in FIG. 2F) are connected in parallel as mentioned earlier. Therefore, even when the insulating ink that is used to form the insulating layer 70 moves on the wiring line (that is, the mesh) of the connection portion 62a from the outline 74 of the insulating layer 70 surrounding the through hole 73, it is possible to prevent the entire connection portion 62a from being covered with the insulating ink.

As described above, the mesh wiring of a contact region for electrical connection with a conductor other than the wiring pattern is based on the configuration of the parallel wiring line 15 explained with reference to FIG. 2A as the basic embodiment of this invention. By forming the contact region by using the mesh wiring, it is possible to prevent poor conduction.

As a form using the mesh wiring, in addition to the forms depicted in FIGS. 7 and 8, a form in which mesh wiring is formed over the entire area in the through hole of the insulating layer is also allowed. In this form, the insulating ink flowing thereinto by moving on the mesh wiring from the entire perimeter of the outline surrounding the through hole does not reach the contact region located at the center of the through hole.

Moreover, in the above-described forms, the constitutional unit of the mesh is a quadrilateral, but the constitutional unit of the mesh may be a regular hexagon in which three wiring lines meet at each node.

Furthermore, the outline of a non-printing region (that is, a non-covered region) including a contact region is not limited to the entire perimeter of the non-printing region, such as the outline of a through hole provided in an insulating layer. The outline of the non-printing region (that is, the non-covered region) may be part of the perimeter of the non-printing region, such as a situation in which the non-printing region is surrounded with part of the outline and the contour of a substrate, for example.

The terms such as "first" and "second" in the above descriptions are terms used to explain the configurations of the embodiment clearly. The present invention is not limited by these terms themselves, that is, the order of the component elements itself. In addition, the use of such terms is not intended to impose such limitations.

As used throughout this disclosure, the singular forms "a", "an", and "the" include plural reference unless the context clearly dictates otherwise.

The foregoing description of the embodiments of the invention has been presented for the purpose of illustration and description. It is not intended to be exhaustive or to limit the invention to the precise form disclosed. Modifications or variations are possible in light of the above teachings. The embodiment was chosen and described to provide the illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

The invention claimed is:

1. An electronic device comprising:
a wiring pattern formed on a base; and
an insulating layer that covers the wiring pattern in such a way that a contact region that belongs to the wiring pattern and is used for electrical connection with a conductor other than the wiring pattern is exposed, wherein
in a non-covered region including the contact region, the wiring pattern includes adjacent parallel wiring line strings in a same layer as a rest of the wiring pattern, each of the adjacent parallel wiring line strings being part of an exposed wiring line leading to the contact region,
the exposed wiring line leading to the contact region extends from a position on the wiring pattern at which the wiring pattern overlaps with an outline of the non-covered region, in such a way that the exposed wiring line leading to the contact region connects to a part of the wiring pattern covered by the insulating layer at the position on the wiring pattern at which the wiring pattern overlaps with the outline of the non-covered region,
the each of the adjacent parallel wiring line strings includes two nodes and at least two paths connecting the two nodes,
an insulating material that is a same as an insulating material used for a formation of the insulating layer continuously adheres to a portion of the exposed wiring line leading to the contact region in the non-covered region, the portion including the position on the wiring pattern at which the wiring pattern overlaps with the outline of the non-covered region and excluding the contact region, and
the adjacent parallel wiring strings prevent insulating ink from spreading to and covering the contact region.

2. The electronic device according to claim 1, wherein the wiring pattern is formed of hardened conductive ink.

* * * * *